US012721084B2

(12) United States Patent
Goshi

(10) Patent No.: US 12,721,084 B2
(45) Date of Patent: Aug. 25, 2026

(54) SUBSTRATE PROCESSING METHOD AND SUBSTRATE PROCESSING APPARATUS

(71) Applicant: Tokyo Electron Limited, Tokyo (JP)

(72) Inventor: Gentaro Goshi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 18/294,339

(22) PCT Filed: Jul. 22, 2022

(86) PCT No.: PCT/JP2022/028434
§ 371 (c)(1),
(2) Date: Feb. 1, 2024

(87) PCT Pub. No.: WO2023/013435
PCT Pub. Date: Feb. 9, 2023

(65) Prior Publication Data

US 2025/0087501 A1 Mar. 13, 2025

(30) Foreign Application Priority Data

Aug. 5, 2021 (JP) ................................ 2021-129085

(51) Int. Cl.
*H01L 21/67* (2006.01)
*H01L 21/02* (2006.01)
(Continued)

(52) U.S. Cl.
CPC .......... *H10P 72/0416* (2026.01); *H10P 70/80* (2026.01)

(58) Field of Classification Search
CPC .. H10P 72/0416; H10P 70/80; H10P 72/0402; H10P 52/00; H10P 72/0406; H10P 72/0408; H10P 70/20
See application file for complete search history.

(56) References Cited

U.S. PATENT DOCUMENTS 7,550,075 B2 * 6/2009 Bertram ................ B08B 7/0021 96/397
12,374,565 B2 * 7/2025 Goshi ................ H10P 72/0408
(Continued)

FOREIGN PATENT DOCUMENTS

JP S63-179530 A 7/1988
JP 2002-373880 A 12/2002
(Continued)

OTHER PUBLICATIONS

CN 111623855 (Year: 2020).*
International Search Report for PCT/JP2022/028434 dated Oct. 11, 2022.

*Primary Examiner* — Alexander Markoff
(74) *Attorney, Agent, or Firm* — Chrisman Gallo Tochtrop LLC

(57) ABSTRACT

A substrate processing method performed in a substrate processing apparatus configured to process a substrate by bringing the substrate into contact with a processing fluid in a supercritical state is provided. The substrate processing apparatus includes: a processing vessel having a processing space; a main supply line configured to supply the processing fluid to the processing space; a discharge line having a first opening/closing valve, the discharge line being configured to discharge the processing fluid from the processing space; and a bypass line branched off from the main supply line at a branch point, the bypass line joining the discharge line at a junction point downstream of the first opening/closing valve. The substrate processing method includes: increasing a pressure of the processing space up to a preset processing pressure; and maintaining, after the increasing of the pressure, the pressure of the processing space at the processing pressure.

8 Claims, 7 Drawing Sheets

(51) Int. Cl.
*H10P 70/00* (2026.01)
*H10P 72/00* (2026.01)

(56) References Cited

U.S. PATENT DOCUMENTS

| | | | | |
|---|---|---|---|---|
| 12,456,632 | B2 * | 10/2025 | Inoue | H10P 72/0408 |
| 12,550,659 | B2 * | 2/2026 | Ihara | H10P 72/0408 |
| 2001/0010096 | A1 * | 7/2001 | Horton, Jr. | H04L 12/2801<br>725/111 |
| 2006/0135047 | A1 * | 6/2006 | Sheydayi | H10P 72/0416<br>451/388 |
| 2006/0154482 | A1 * | 7/2006 | Kondoh | H10W 20/033<br>257/E21.17 |
| 2018/0138035 | A1 * | 5/2018 | Ohno | H10P 70/80 |
| 2018/0138058 | A1 * | 5/2018 | Egashira | H10P 72/0408 |
| 2020/0047224 | A1 * | 2/2020 | Fukui | B08B 9/08 |
| 2020/0246723 | A1 * | 8/2020 | Goshi | B01D 11/0411 |
| 2021/0104418 | A1 * | 4/2021 | Park | H10P 72/0414 |
| 2022/0130690 | A1 * | 4/2022 | Ihara | H10P 72/0408 |
| 2022/0148890 | A1 * | 5/2022 | Sawachi | H10P 72/0402 |
| 2022/0161288 | A1 * | 5/2022 | Ding | B05B 12/06 |
| 2022/0208566 | A1 * | 6/2022 | Goshi | H10P 72/0408 |

FOREIGN PATENT DOCUMENTS

| | | | |
|---|---|---|---|
| JP | 2004-225152 | A | 8/2004 |
| JP | 2004-228526 | A | 8/2004 |
| JP | 2005-183749 | A | 7/2005 |
| JP | 2006-319207 | A | 11/2006 |
| JP | 2007-234862 | A | 9/2007 |
| JP | 2008-182034 | A | 8/2008 |
| JP | 2008-532268 | A | 8/2008 |
| JP | 2020-126974 | A | 8/2020 |
| JP | 2021-061400 | A | 4/2021 |
| JP | 2021-086857 | A | 6/2021 |
| WO | 2006/091264 | A1 | 8/2006 |

* cited by examiner

FIG. 4

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2022/028434 filed on Jul. 22, 2022, which claims the benefit of Japanese Patent Application No. 2021-129085 filed on Aug. 5, 2021, the entire disclosures of which are incorporated herein by reference.

TECHNICAL FIELD

The various aspects and embodiments described herein pertain generally to a substrate processing method and a substrate processing apparatus.

BACKGROUND

In a semiconductor device manufacturing process including forming a stacked structure of integrated circuits on a surface of a substrate such as a semiconductor wafer (hereinafter, sometimes simply referred to as a wafer), there is known a substrate processing in which a processing fluid in a supercritical state containing an additive added thereto is sealed inside a processing vessel over a long period of time (see Patent Document 1).

Patent Document 1: Japanese Translation of PCT Application Patent Publication No. 2008-532268

SUMMARY

In an exemplary embodiment, a substrate processing method performed in a substrate processing apparatus configured to process a substrate by bringing the substrate into contact with a processing fluid in a supercritical state is provided. The substrate processing apparatus includes a processing vessel, a main supply line, a discharge line and a bypass line. The processing vessel has a processing space in which the substrate is accommodated. The main supply line is configured to supply the processing fluid to the processing space. The discharge line has a first opening/closing valve, and the discharge line is configured to discharge the processing fluid from the processing space. The bypass line is branched off from the main supply line at a branch point, and the bypass line joins the discharge line at a junction point downstream of the first opening/closing valve. Further, the substrate processing method includes a pressure increasing process and a maintaining process. In the pressure increasing process, a pressure of the processing space is increased up to a preset processing pressure by supplying the processing fluid to the processing space from the main supply line in a state that the substrate is accommodated in the processing space. In the maintaining process, after the pressure increasing process, the pressure of the processing space is maintained at the processing pressure while allowing the processing fluid to flow through the bypass line in a state that the first opening/closing valve is closed.

BRIEF DESCRIPTION OF THE DRAWINGS

FIG. 4 is a diagram illustrating an example configuration of a supply line and a discharge line connected to the substrate processing device according to the exemplary embodiment.

DETAILED DESCRIPTION

Hereinafter, exemplary embodiments of a substrate processing method and a substrate processing apparatus according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

In a semiconductor device manufacturing process in which a stacked structure of integrated circuits is formed on a surface of a substrate such as a semiconductor wafer (hereinafter, sometimes simply referred to as a wafer), there is known a substrate processing in which a processing fluid in a supercritical state containing an additive added thereto is sealed in a processing vessel over a long period of time.

Meanwhile, when sealing the processing fluid in the supercritical state of a high pressure within the processing vessel, the processing fluid may leak from a valve or the like. Thus, it has been difficult to stably seal the processing fluid in the supercritical state inside the processing vessel stably over a long period of time.

In view of the foregoing, there is a demand for a technique capable of overcoming the aforementioned problem and stably sealing the processing fluid in the supercritical state inside the processing vessel over a long period of time.

<Outline of Substrate Processing System>

Figure 1:
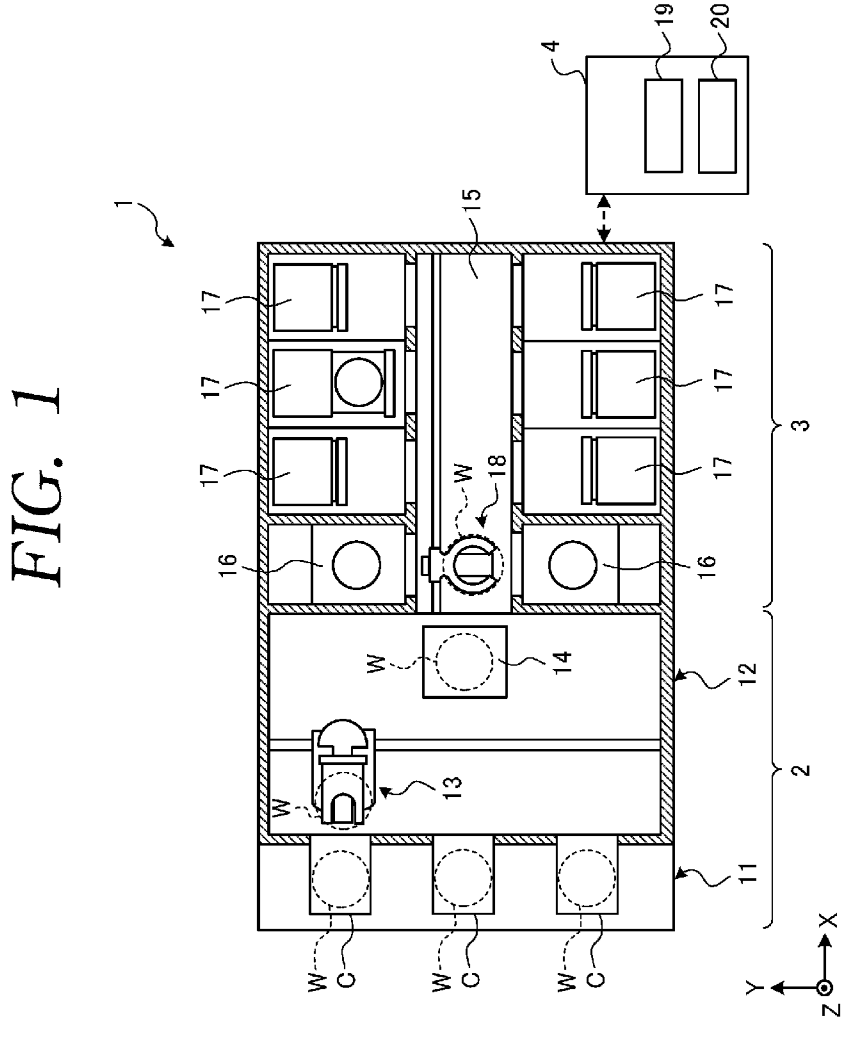
FIG. 1 is a diagram illustrating a schematic configuration of a substrate processing system according to an exemplary embodiment.

First, a schematic configuration of a substrate processing system 1 according to an exemplary embodiment will be described with reference to FIG. 1. FIG. 1 is a diagram illustrating the schematic configuration of the substrate processing system 1 according to the exemplary embodiment. Hereinafter, in order to clarify positional relationships, the X-axis, Y-axis, and Z-axis that are orthogonal to each other will be defined, and the positive Z-axis direction will be regarded as a vertically upward direction.

As depicted in FIG. 1, the substrate processing system 1 is equipped with a carry-in/out station 2 and a processing station 4. The substrate processing system 1 is an example of a substrate processing apparatus. The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to horizontally accommodate therein a plurality of semiconductor wafers W (hereinafter, referred to as "wafers W"). The wafer W is an example of a substrate.

The transfer section 12 is provided adjacent to the carrier placing section 11 and equipped with a substrate transfer device 13 and a delivery module 14. The substrate transfer device 13 is equipped with a wafer holding mechanism configured to hold the wafer W. Further, the substrate transfer device 13 is movable in a horizontal direction and a vertical direction and pivotable around a vertical axis, and serves to transfer the wafer W between the carrier C and the delivery module 14 by using the wafer holding mechanism.

The processing station 3 is provided adjacent to the transfer section 12. The processing station 3 is equipped with a transfer section 15, a plurality of supply devices 16, and a plurality of substrate processing devices 16. The plurality of supply devices 16 and the plurality of substrate processing devices 17 are arranged on both sides of the transfer section 15. The number and the layout of the supply devices 16 and the substrate processing devices 17 shown in FIG. 1 are nothing more than an example, and the present exemplary embodiment is not limited thereto.

The transfer section 15 has therein a substrate transfer device 18. The substrate transfer device 18 is equipped with a wafer holding mechanism configured to hold the wafer W. Further, the substrate transfer device 18 is movable in a horizontal direction and a vertical direction and pivotable around a vertical axis, and serves to transfer the wafer W between the delivery module 14, the supply device 16 and the substrate processing device 17 by using the wafer holding mechanism.

The supply device 16 is configured to perform a preset additive supplying processing on the wafer W transferred by the substrate transfer device 18. A configuration example of the supply device 16 will be described later.

The substrate processing device 17 is configured to perform a preset substrate processing on the wafer W to which the additive is added by the supply device 16. A configuration example of the substrate processing device 17 will be elaborated later.

Further, the substrate processing system 1 is equipped with a control device 4. The control device 4 is, by way of example, a computer, and includes a controller 19 and a storage 20.

The controller 19 includes various circuits, and a microcomputer having a CPU (Central Processing Unit), a ROM (Read Only Memory), a RAM (Random Access Memory), an input/output port, and the like. The CPU of such a microcomputer implements a control to be described later by reading and executing a program stored in the ROM.

Further, such a program may be recorded on a computer-readable recording medium, and may be installed from the recording medium to the storage 20 of the control device 4. The computer-readable recording medium may be, by way of non-limiting example, a hard disk (HD), a flexible disk (FD), a compact disk (CD), a magnet optical disk (MO), a memory card, or the like.

The storage 20 is implemented by, for example, a semiconductor memory device such as RAM or a flash memory, or a storage device such as a hard disk or an optical disk.

In the substrate processing system 1 configured as described above, first, the substrate transfer device 13 of the carry-in/out station 2 takes out the wafer W from the carrier C placed in the carrier placing section 11, and places the taken wafer W in the delivery module 14. The wafer W placed in the delivery module 14 is taken out from the delivery module 14 by the substrate transfer device 18 of the processing station 3 to be carried into the supply device 16.

The wafer W carried into the supply device 16 is subjected to the additive supplying processing by the supply device 16, and is then carried out from the supply device 16 by the substrate transfer device 18. The wafer W taken out from the supply device 16 is carried into the substrate processing device 17 by the substrate transfer device 18 to be subjected to the substrate processing by the substrate processing device 17.

The wafer W after being subjected to the substrate processing by the substrate processing device 17 is carried out from the substrate processing device 17 by the substrate transfer device 18, and placed in the delivery module 14. Then, the wafer W placed in the delivery module 14 after being subjected to all the required processings is returned back to the carrier C of the carrier placing section 11 by the substrate transfer device 13.

<Configuration of Supply Device>

Figures 2, 3:
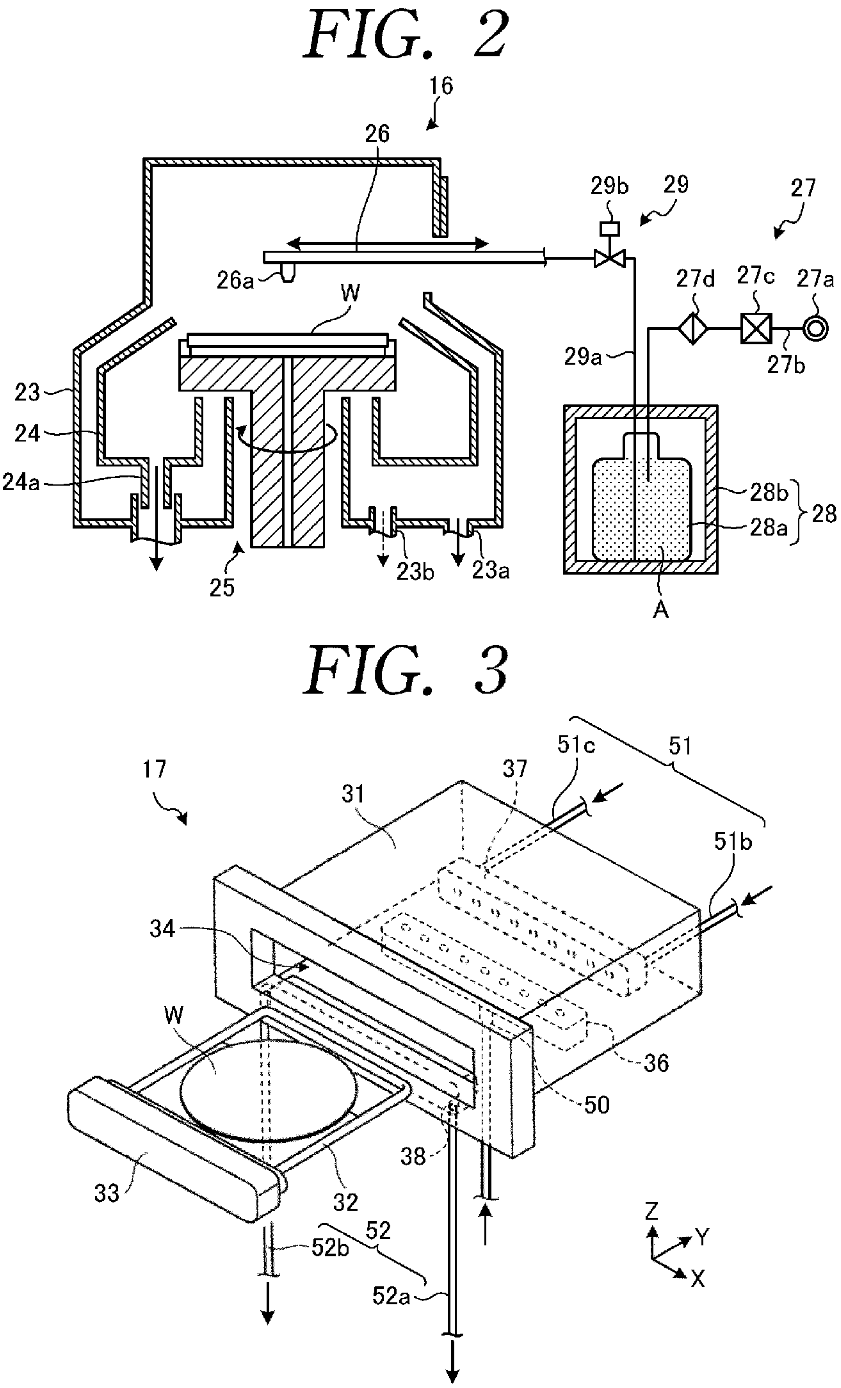
FIG. 2 is a cross sectional view illustrating an example configuration of a supply device according to the exemplary embodiment.
FIG. 3 is an exterior perspective view illustrating an example configuration of a substrate processing device.

Now, a configuration of the supply device 16 will be explained with reference to FIG. 2. FIG. 2 is a cross sectional view illustrating an example of the configuration of the supply device 16 according to the exemplary embodiment. For example, the supply device 16 is configured as a single-wafer supply device configured to add an additive A to top surfaces of the wafers W sheet by sheet.

As depicted in FIG. 2, the supply device 16 holds the wafer W in a substantially horizontal manner with the wafer holding mechanism 25 disposed in an outer chamber 23 forming therein a processing space, and rotates the wafer W by rotating this wafer holding mechanism 25 around a vertical axis.

Then, the supply device 16 allows a nozzle arm 26 to be advanced to above the wafer W being rotated, and performs the additive supplying processing on the top surface of the wafer W by supplying the additive A from a nozzle 26*a* provided at a leading end of the nozzle arm 26.

The additive A supplied in the above-described additive supplying processing may be, by way of example, a mixed solution of a low-valence alcohol (for example, ethanol, methanol, IPA (isopropyl alcohol), etc.) and a liquid having a polarity different from that of the low-valence alcohol. Further, the additive A is a liquid having high affinity for $CO_2$ (carbon dioxide) that is used as a processing fluid.

Such an additive A is previously mixed at a certain ratio and stored in a reservoir 28. The reservoir 28 has a tank 28*a* and a sealed container 28*b*. In the tank 28*a*, the additive A previously mixed at the certain ratio is stored.

Further, the tank 28*a* may have therein an agitating mechanism (not shown). Thus, the additive A, which is a mixture of multiple types of chemical liquids with different polarities, can be supplied to the wafer W in a well-mixed state.

The sealed container 28*b* accommodates the tank 28*a* therein, and isolates an internal space in which the tank 28*a* is accommodated from an external space.

Further, the controller 19 (see FIG. 1) controls a nitrogen gas supply 27 to supply a nitrogen gas into the tank 28*a*, thus increasing an internal pressure of the sealed container 28*b*. Accordingly, the additive A is supplied to the nozzle 26*a* through an additive supply path 29*a* of an additive supply 29 connected between the inside of the tank 28*a* and the nozzle 26*a*.

The nitrogen gas supply 27 has a nitrogen gas supply source 27*a*, a nitrogen gas supply path 27*b*, a flow rate controller 27*c*, and a filter 27*d*. The nitrogen gas supply source 27*a* is, for example, a tank that stores therein the nitrogen gas. The nitrogen gas supply path 27*b* connects the nitrogen gas supply source 27*a* to the inside of the tank 28*a*, thus allowing the nitrogen gas to be supplied from the nitrogen gas supply source 27*a* into the tank 28*a*.

The flow rate controller 27*c* is disposed in the nitrogen gas supply path 27*b* to adjust a flow rate of the nitrogen gas supplied into the tank 28*a*. The flow controller 27*c* has an opening/closing valve, a flow control valve, a flow meter, and so forth. The filter 27*d* filters the nitrogen gas flowing through the nitrogen gas supply path 27*b*.

Additionally, a valve 29*b* is provided in the additive supply path 29*a* of the additive supply 29. The controller 19 is capable of controlling the supply of the additive A to the nozzle 26*a* by opening and closing the valve 29*b*.

In the additive supplying processing according to the exemplary embodiment, while rotating the wafer holding mechanism 25, the additive A is supplied to the entire top surface of the wafer W, and, then, the rotation of the wafer holding mechanism 25 is gently stopped.

The wafer W after being subjected to the additive supplying processing in this way is delivered, with the additive A in a liquid state accumulated on the top surface thereof, that is, with a liquid film of the additive A formed on the top surface thereof, to the substrate transfer device 18 by a non-illustrated delivery device that belongs to the wafer holding mechanism 25. Thereafter, the wafer W is carried out from the supply device 16.

In addition, in this additive supplying processing, the additive A overflowing from the wafer W is received by the outer chamber 23 and an inner cup 24 disposed in the outer chamber 23.

Then, the additive A is drained from a drain port 23*a* provided at a bottom of the outer chamber 23 and a drain port 24*a* provided at a bottom of the inner cup 24. Also, an atmosphere within the outer chamber 23 is exhausted from an exhaust port 23*b* provided at the bottom of the outer chamber 23.

The wafer W having the additive A accumulated thereon as a result of being subjected to the additive supplying processing in the supply device 16 is then transferred to the substrate processing device 17.

Subsequently, in the substrate processing device 17, the additive A on the top surface of the wafer W is mixed with a processing fluid in a supercritical state (hereinafter, referred to as "supercritical fluid"), and this supercritical fluid is brought into contact with the wafer W, so that the substrate processing on the wafer W is carried out.

<Configuration of Substrate Processing Device>

Now, a configuration of the substrate processing device 17 will be explained with reference to FIG. 3. FIG. 3 is an exterior perspective view illustrating an example of the configuration of the substrate processing device 17 according to the exemplary embodiment.

As depicted in FIG. 3, the substrate processing device 17 has a processing vessel 31, a holding plate 32, and a cover member 33. An opening 34 for carry-in/carry-out of the wafer W is formed in the processing vessel 31. The holding plate 32 holds thereon the wafer W as a processing target in a horizontal direction. The cover member 33 supports the holding plate 32, and seals the opening 34 when the wafer W is carried into the processing vessel 31.

The processing vessel 31 has therein a processing space in which the wafer W having a diameter of, e.g., 300 mm can be accommodated. A first supply header 36, a second supply header 37, and a discharge header 38 are provided in the processing space.

Each of the first supply header 36, the second supply header 37, and the discharge header 38 is provided with a multiple number of openings arranged in a lengthwise direction, specifically, in a horizontal direction (X-axis direction) orthogonal to a carrying-in/out direction (Y-axis direction) of the wafer W.

The first supply header 36 is connected to a main supply line 50, and supplies the processing fluid fed from this main supply line 50 into the processing space.

Specifically, the first supply header 36 is disposed at a bottom of the processing space with the multiple number of openings thereof facing upwards, and is configured to supply the processing fluid toward a bottom surface of the wafer W from below the wafer W (not shown) accommodated in the processing space.

In addition, the first supply header 36 may not necessarily have to supply the processing fluid upwards as long as it is capable of supplying the processing fluid to the processing space from below the wafer W at least.

The second supply header 37 is connected to an auxiliary supply line 51, and supplies the processing fluid supplied from this auxiliary supply line 51 to the processing space. A downstream end of the auxiliary supply line 51 is branched off into branch supply lines 51*b* and 51*c*.

The branch supply line 51*b* is connected to one end of the second supply header 37 in a lengthwise direction thereof, and the branch supply line 51*c* is connected to the other end of the second supply header 37 in the lengthwise direction thereof.

In the processing space, the second supply header 37 is provided adjacent to the side opposite to where the opening 34 is provided. The multiple number of openings formed at the second supply header 37 are disposed above the wafer W (not shown) accommodated in the processing space, and are oriented toward the opening 34. The second supply header 37 supplies the processing fluid from the auxiliary supply line in a substantially horizontal manner toward the opening 34 from the side opposite to the opening 34 in the processing space.

The discharge header 38 is connected to a discharge line 52. In the processing space, the discharge header 38 is provided adjacent to the side where the opening 34 is provided, and positioned below the opening 34. The multiple number of openings formed at the discharge header 38 are oriented toward the second supply header 37. This discharge header 38 discharges the processing fluid within the processing space into the discharge line 52.

Further, an upstream end of the discharge line 52 is branched off into branch discharge lines 52*a* and 52*b*. The branch discharge line 52*a* is connected to one end of the discharge header 38 in a lengthwise direction thereof, and the branch discharge line 52*b* is connected to the other end of the discharge header 38 in the lengthwise direction thereof.

The substrate processing device 17 supplies the processing fluid from the main supply line 50 into the processing space of the processing vessel 31 via the first supply header 36, thereby increasing a pressure of the processing space (a pressure increasing processing to be described later).

Then, in the substrate processing device 17, valves 109, 111, and 118 (see FIG. 4) provided in the main supply line 50, the auxiliary supply line 51, and the discharge line 52, respectively, are all closed.

As a result, the processing space of the processing vessel 31 is maintained at a certain processing pressure P1 (see FIG. 5) (a maintaining processing to be described later), and a required substrate processing is performed on the wafer W by the processing fluid to which the additive A is added. Such a substrate processing includes, by way of non-limiting example, oxidation treatment, deuteration treatment, and hydroxide treatment.

Afterwards, while supplying the processing fluid from the auxiliary supply line 51 to the processing space through the second supply header 37, the substrate processing device 17 discharges the processing fluid in the processing space into the discharge line 52 through the discharge header 38 (a flowing processing to be described later).

As a result, a laminar flow of the processing fluid flowing around the wafer W in a predetermined direction is formed in the processing space. For example, this laminar flow of the processing fluid flows above the wafer W from the second supply header 37 toward a space above the opening 34 along the top surface of the wafer W. Then, this laminar flow of the processing fluid changes its flowing direction from above to below the opening 34, and flows toward the discharge header 38 after passing through the vicinity of the opening 34.

Figure 4:
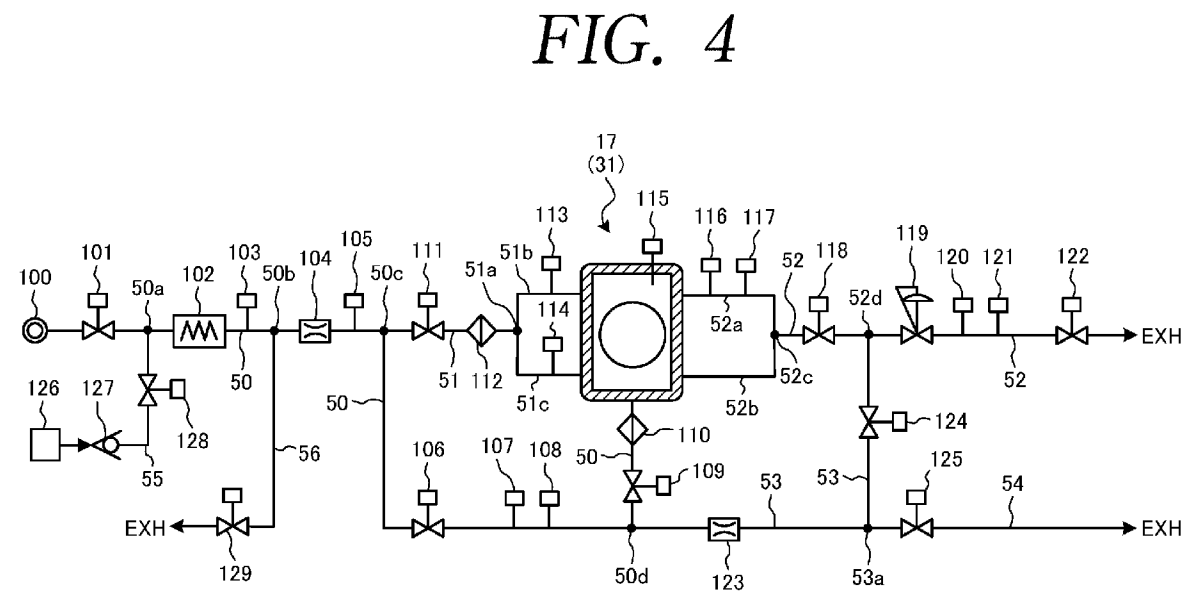

Now, a configuration of the supply line and the discharge line connected to the substrate processing device 17 will be discussed with reference to FIG. 4. FIG. 4 is a diagram illustrating an example of the configuration of the supply line and the discharge line connected to the substrate processing device 17.

As shown in FIG. 4, the supply line for the processing fluid according to the exemplary embodiment includes the main supply line 50 and the auxiliary supply line 51. One end of the main supply line 50 is connected to a fluid source 100, which is a source of the processing fluid, and the other end thereof is connected to the first supply header 36 (see FIG. 3) inside the processing vessel 31.

The fluid source 100 is, for example, a tank that stores therein $CO_2$, which is an example of the processing fluid. The processing fluid stored in the fluid source 100 is supplied to the main supply line 50 and the auxiliary supply line 51.

The main supply line 50 is provided with a valve 101, a junction portion 50*a*, a heater 102, a pressure sensor 103, a branch portion 50*b*, an orifice 104, a temperature sensor 105, a branch portion 50*c*, a valve 106, and a pressure sensor 107 in sequence from the upstream side toward the downstream side.

In addition, the main supply line 50 is also provided with a temperature sensor 108, a branch portion 50*d*, a valve 109, and a filter 110 in sequence from the pressure sensor 107 toward the downstream side. The branch portion 50*d* is an example of a branch point. Moreover, the terms "upstream side" and "downstream side" in the present disclosure are based on the flowing direction of the processing fluid.

The valve 101 is a valve configured to control on and off of the supply of the processing fluid from the fluid source 100. In an open state, the valve 101 allows the supercritical fluid to flow in the main supply line 50 on the downstream side, whereas in a closed state, the valve 10 does not allow the supercritical fluid to flow in the main supply line 50 on the downstream side.

By way of example, when the valve 101 is in the open state, the processing fluid turned into the supercritical state by being pressurized to about 19 MPa to 20 MPa is supplied from the fluid source 100 to the main supply line 50 through the valve 101.

The heater 102 is configured to heat the processing fluid flowing downstream of the valve 101. The pressure sensor 103 is configured to detect a pressure of the processing fluid flowing through the main supply line 50 between the heater 102 and the branch portion 50*b*.

The orifice 104 is configured to adjust the pressure of the processing fluid supplied from the fluid source 100. The temperature sensor 105 is configured to detect a temperature of the processing fluid flowing through the main supply line 50 between the orifice 104 and the branch portion 50*c*. The valve 106 is configured to adjust on and off of the supply of the processing fluid to the branch portion 50*d* of the main supply line 50.

The pressure sensor 107 is configured to detect the pressure of the processing fluid flowing through the main supply line 50 between the valve 106 and the temperature sensor 108. The temperature sensor 108 is configured to detect the temperature of the processing fluid flowing through the main supply line 50 between the pressure sensor 107 and the branch portion 50*d*.

The valve 109 is an example of a second opening/closing valve, and is configured to adjust on and off of the supply of the processing fluid to the first supply header 36 of the substrate processing device 17. The filter 110 is configured to remove a foreign substance contained in the processing fluid flowing through the main supply line 50.

Additionally, the main supply line 50 is connected to a purge line 55 at the junction portion 50*a*. One end of the purge line 55 is connected to a purge gas supply source 126, and the other end thereof is connected to the junction portion 50*a* of the main supply line 50.

The purge gas supply source 126 is, for example, a tank that stores therein a purge gas. The purge gas is, for example, an inert gas such as a nitrogen gas. The purge line 55 is provided with, at portions thereof, a check valve 127 and a valve 128 in sequence from the purge gas supply source 126 side to the main supply line 50 side.

For example, the purge gas stored in the purge gas supply source 126 is supplied into the processing space of the substrate processing device 17 through the purge line 55 and the main supply line 50 while the supply of the processing fluid into the processing space of the substrate processing device 17 is stopped.

Further, the main supply line 50 is connected to a branch line 56 at the branch portion 50*b*. One end of the branch line 56 is connected to the branch portion 50*b* of the main supply line 50, and the other end thereof is connected to an exhaust device EXH. A valve 129 is provided at a portion of the branch line 56.

The auxiliary supply line 51 is connected to the branch portion 50*c* of the main supply line 50 on the upstream side. On the downstream side, the auxiliary supply line 51 is branched off into the branch supply line 51*b* and the branch supply line 51$c$ at a branch portion 51$a$, and is connected to the second supply header 37 (see FIG. 3) within the processing vessel 31.

The auxiliary supply line 51 is provided with the valve 111, the filter 112, and the branch portion 51$a$ in order from the branch portion 50$c$ toward the downstream side. The valve 111 is configured to adjust on and off of the supply of the processing fluid to the second supply header 37 of the substrate processing device 17. The filter 112 serve to remove a foreign substance contained in the processing fluid flowing through the auxiliary supply line 51.

The branch supply lines 51$b$ and 51$c$ are provided with temperature sensors 113 and 114, respectively. The temperature sensors 113 and 114 are configured to detect the temperature of the processing fluid flowing through the auxiliary supply line 51 in the branch supply lines 51$b$ and 51$c$, respectively.

A temperature sensor 115 is provided in the processing vessel 31 of the substrate processing device 17. The temperature sensor 115 is configured to detect the temperature of the processing space inside the processing vessel 31.

One end of the discharge line 52 is connected to the discharge header 38 (see FIG. 3) inside processing vessel 31, and the other end thereof is connected to an exhaust device EXH at the other end.

The upstream side of the discharge line 52, which is connected to the discharge header 38, is branched off into a branch discharge line 52$a$ and a branch discharge line 52$b$. The branch discharge line 52$a$ and the branch discharge line 52$b$ join each other at a junction portion 52$c$ on the downstream side.

The branch discharge line 52$a$ is provided with a temperature sensor 116 and a pressure sensor 117 in order from the upstream side toward the downstream side. The temperature sensor 116 is configured to detect the temperature of the processing fluid flowing through the branch discharge line 52$a$. The pressure sensor 117 is configured to detect the pressure of the processing fluid flowing through the branch discharge line 52$a$.

The discharge line 52 is provided with the valve 118, a junction portion 52$d$, a control valve 119, a temperature sensor 120, a pressure sensor 121, and a valve 122. The junction portion 52$d$ is an example of a junction point.

The valve 118 is an example of a first opening/closing valve, and is configured to adjust on and off of the discharge of the processing fluid from the substrate processing device 17.

The pressure control valve 119 is configured to adjust the pressure of the processing fluid flowing through the discharge line 52, and is configured as, by way of example, a back pressure valve. The opening degree of the pressure control valve 119 can be adaptively adjusted under the control of the control device 4 based on the pressure of the processing space of the substrate processing device 17. The opening degree of the pressure control valve 119 can be adjusted by, for example, PID (Proportional-Integral-Differential) control.

The temperature sensor 120 is configured to detect the temperature of the processing fluid flowing through the discharge line 52 on the downstream side of the pressure control valve 119. The pressure sensor 121 is configured to detect the pressure of the processing fluid flowing through the discharge line 52 on the downstream side of the pressure control valve 119.

The valve 122 is configured to adjust on and off of the discharge of the processing fluid to the exhaust device EXH. When the processing fluid is discharged to the exhaust device EXH, the valve 122 is opened, and when the processing fluid is not discharged, the valve 122 is closed.

Additionally, in the exemplary embodiment, a bypass line 53 is connected between the main supply line 50 and the discharge line 52. One end of this bypass line 53 is connected to the branch portion 50$d$ of the main supply line 50, and the other end thereof is connected to the junction portion 52$d$ of the discharge line 52.

The bypass line 53 is provided with an orifice 123, a branch portion 53$a$, and a valve 124 in order from the branch portion 50$d$ toward the junction portion 52$d$. The orifice 123 is configured to adjust the pressure of the processing fluid flowing through the bypass line 53. The valve 124 is configured to adjust on and off of the flow of the processing fluid in the bypass line 53.

Also, the bypass line 53 is connected to a branch line 54 at the branch portion 53$a$. One end of the branch line 54 is connected to the branch portion 53$a$ of the bypass line 53, and the other end thereof is connected to an exhaust device EXH. A valve 125 is provided at a portion of the branch line 54.

Exemplary Embodiment

Figure 5:
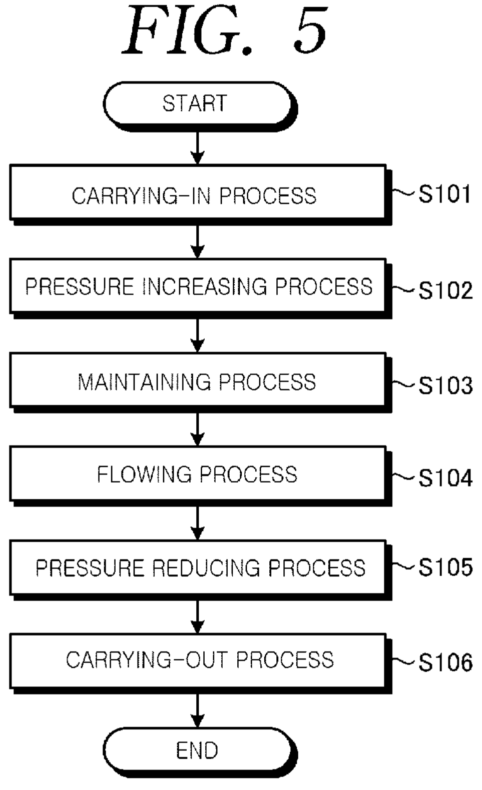
FIG. 5 is a flowchart illustrating an example sequence of processings performed by the substrate processing device according to the exemplary embodiment.
Figure 6:
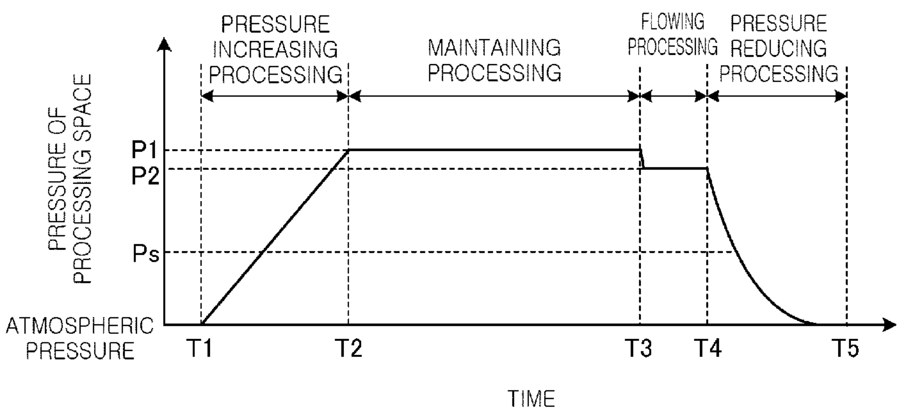
FIG. 6 is a diagram illustrating an example of a pressure variation in a processing space over time during a pressure increasing processing, a maintaining processing, a flowing processing, and a pressure reducing processing according to the exemplary embodiment.

Next, details of the substrate processing according to the exemplary embodiment will be described with reference to FIG. 5 to FIG. 11. FIG. 5 is a flowchart showing an example sequence of respective processings performed by the substrate processing device 17 according to the exemplary embodiment, and FIG. 6 illustrates an example of a pressure variation in the processing space over time during the pressure increasing processing, the maintaining processing, the flowing processing, and a pressure reducing processing according to the exemplary embodiment.

Further, the sequence of the respective processings shown in FIG. 5 is executed as the controller 19 (see FIG. 1) reads out the program stored in the storage 20 (see FIG. 1) of the control device 4 (see FIG. 1) and controls the substrate processing device 17 based on the read command.

In addition, at a starting time point of a carrying-in processing in a process S101, all of the valves 101, 106, 109, 111, 118, 122, 124, 125, 128, and 129 and the pressure control valve 119 shown in FIG. 4 are in the closed state.

As shown in FIG. 5, in the substrate processing device 17, the carrying-in processing of carrying the wafer W having the additive A accumulated thereon into the processing space (process S101) is first performed. In this carrying-in processing, first, the wafer W on which the additive A in the liquid state is accumulated is held on the holding plate 32 (see FIG. 3). Thereafter, the holding plate 32 and the cover member 33 are accommodated inside the processing vessel 31 together with the wafer W, and the opening 34 is closed by the cover member 33.

Figure 7:
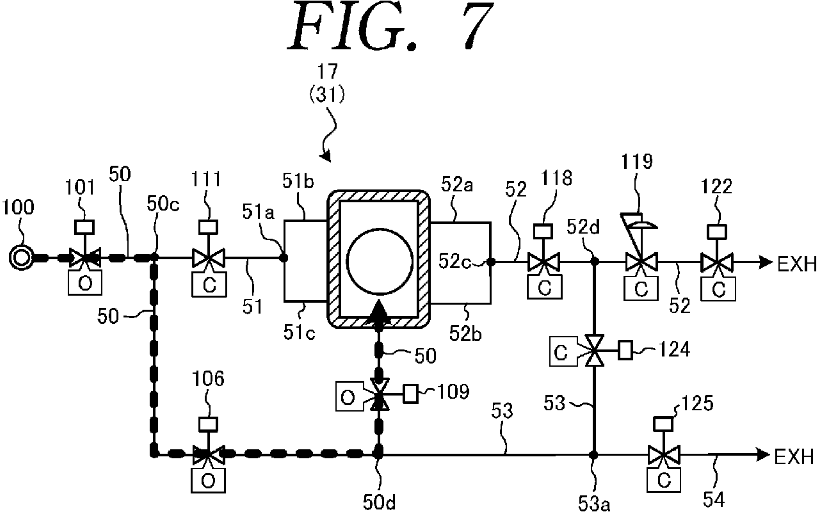
FIG. 7 is a diagram illustrating an operation example of the pressure increasing processing according to the exemplary embodiment.

Next, in the substrate processing device 17, the pressure increasing processing is performed (process S102). In this pressure increasing processing, the valves 101, 106, and 109 of the main supply line 50 are turned into the open state, as illustrated in FIG. 7. FIG. 7 is a diagram showing an operation example of the pressure increasing processing according to the exemplary embodiment.

Accordingly, as indicated by a thick dashed line in FIG. 7, the processing fluid in the supercritical state is supplied into the processing space from the fluid source 100 through the main supply line 50. In this pressure increasing processing, the valve 111 of the auxiliary supply line 51, the valves 118 and 122 and the pressure control valve 119 of the discharge line 52, the valve of the bypass line 53 124, and the valve 125 of the branch line 54 are kept closed.

With this configuration, as the processing fluid is supplied into the processing space within the substrate processing device 17, the pressure of this processing space increases. Specifically, as shown in FIG. 6, as the pressure increasing processing is performed from time T1 to time T2, the pressure of the processing space increases from an atmospheric pressure up to a processing pressure P1.

The processing pressure P1 is a pressure exceeding a threshold pressure Ps (about 7.2 MPa) at which $CO_2$, which is the processing fluid, is turned into the supercritical state. For example, the processing pressure P1 is about 18 MPa. Through this pressure increasing processing, the processing fluid in the processing space undergoes a phase change into the supercritical state, and is mixed with the additive A accumulated on the top surface of the wafer W.

Further, in the pressure increasing processing, the processing fluid is supplied to the bottom surface of the wafer W from the first supply header 36 (see FIG. 3) disposed below the wafer W. Therefore, the additive A accumulated on the top surface of the wafer W is suppressed from overflowing as a result of the processing fluid coming into contact with the top surface of the wafer W.

Furthermore, in FIG. 7 to FIG. 12, to ease understanding, illustration of components other than the main supply line 50, the auxiliary supply line 51, the discharge line 52, the bypass line 53, the branch line 54, and the plurality of valves provided in the respective lines are omitted. Additionally, in FIG. 7 to FIG. 12, the valves in the open state are marked with 'O', whereas the valves in the closed state are marked with 'C'.

Next, as shown in FIG. 5, the maintaining processing is performed in the substrate processing device 17 (process S103). In this maintaining processing, the processing space within the substrate processing device 17 is isolated, and the pressure of the processing space is maintained at the processing space P1 from time T2 to time T3 (for example, for several hours), as illustrated in FIG. 6, allowing the required processing to be performed on the wafer W in the processing space.

Figure 8:
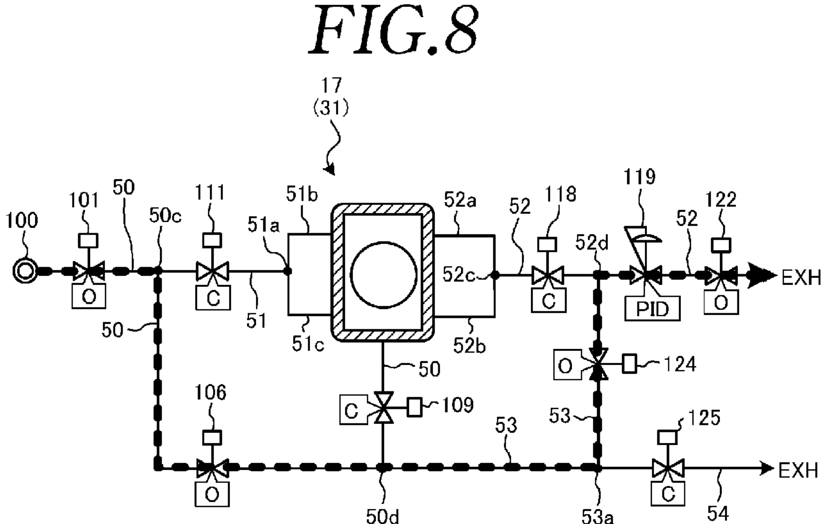
FIG. 8 is a diagram illustrating an operation example of the maintaining processing according to the exemplary embodiment.

In the maintaining processing according to the exemplary embodiment, the valve 109 of the main supply line 50 is turned into the closed state, and the pressure control valve 119 of the discharge line 52 is set into a PID control state (marked with 'PID' in the drawings below), as shown in FIG. 8.

Furthermore, in the maintaining processing, the valve 122 of the discharge line 52 and the valve 124 of the bypass line 53 are turned into the open state. FIG. 8 is a diagram showing an operation example of the maintaining processing according to the exemplary embodiment.

As a result, as indicated by a thick dashed line in FIG. 8, the processing fluid in the supercritical state is supplied from the fluid source 100 via the main supply line 50 to downstream of the junction portion 52*d* between the bypass line 53 and the discharge line 52.

In addition, in this maintaining processing, the valves 101 and 106 of the main supply line 50 are kept open, whereas the valve 111 of the auxiliary supply line 51, the valve 118 of the discharge line 52, and the valve 125 of the branch line 54 are kept closed.

As shown in FIG. 8, in the maintaining processing according to the exemplary embodiment, all the valves 109, 111, and 118 that isolate the processing vessel 31 of the substrate processing device 17 are in contact with the supercritical fluid flowing at a high pressure (e.g., 18 MPa) on their sides opposite to where they are led to the processing vessel 31.

In other words, in the exemplary embodiment, by allowing the supercritical fluid to flow through the bypass line 53, not only the valves 109 and 111 but also the valve 118 of the discharge line 52 are in contact with the supercritical fluid flowing at the high pressure on their sides opposite to where they are led to the processing vessel 31.

Accordingly, even if there is a problem such as a foreign substance stuck in the valves 109, 111, and 118 that isolate the processing vessel 31, it is possible to suppress a leak of the processing fluid in the supercritical state kept in the processing vessel 31. This is because almost no pressure difference causing the leakage occurs on both sides of all the valves 109, 111, and 118 (particularly, the valve 118) that isolate the processing vessel 31.

Therefore, according to the exemplary embodiment, the processing fluid in the supercritical state can be stably sealed inside the processing vessel 31 over a long period of time.

In addition, in the exemplary embodiment, since it is possible to stably seal the processing fluid of the supercritical state in the processing vessel 31 over a long period of time while suppressing replenishment of the processing fluid, a concentration of the additive A in the processing vessel 31 can be maintained stable. Therefore, according to the exemplary embodiment, the required substrate processing can be carried out stably.

Further, in the exemplary embodiment, the controller 19 may detect the pressure of the processing space in the maintaining processing with the pressure sensor 117 (see FIG. 4), and perform the PID control over the pressure control valve 119 based on the detected pressure of the processing space.

For example, when the pressure in the processing space tends to decrease, the controller 19 may reduce the opening degree of the pressure control valve 119 to increase the pressure on the upstream side of the pressure control valve 119 (that is, the side opposite to the side where the valves 109, 111 and 118 are led to the processing vessel 31).

As a result, the processing fluid in the supercritical state can be more stably sealed inside the processing vessel 31 over a long period of time.

In addition, in the maintaining processing according to the exemplary embodiment, the valve 109 provided in the main supply line 50 may be opened and closed regularly. Thus, even when the pressure of the processing space tends to decrease, the pressure of the processing space can be easily returned to the processing pressure P1.

Therefore, according to the exemplary embodiment, the processing fluid in the supercritical state can be more stably sealed inside the processing vessel 31 over a long period of time.

Moreover, in the exemplary embodiment, the fluid source 100 that supplies the processing fluid may be equipped with a decompression mechanism configured to reduce the pressure of the processing fluid supplied to the bypass line 53 or the like to a certain pressure (for example, about 18.5 MPa) during the maintaining processing.

As a result, the amount of the processing fluid discharged to the exhaust device EXH can be reduced during the maintaining processing according to the embodiment, so that the consumption amount of the processing fluid can be reduced. Therefore, according to the exemplary embodiment, the running cost for the maintaining processing can be reduced.

Moreover, the present disclosure is not merely limited to the case where the pressure of the processing fluid supplied to the bypass line 53 or the like is reduced by using decompression mechanism of the fluid source 100. By way of example, each of the valve 111 and the valve 106 may be changed to a decompression valve capable of reducing the pressure on the downstream side, and the pressure of the processing fluid supplied to the bypass line 53 or the like may be reduced by using these two decompression valves during the maintaining processing.

In this way as well, since the amount of the processing fluid discharged to the exhaust device EXH can be reduced during the maintaining processing according to the exemplary embodiment, the consumption amount of processing fluid can be reduced. Thus, according to the embodiment, the running cost for the maintaining processing can be reduced.

Figure 9:
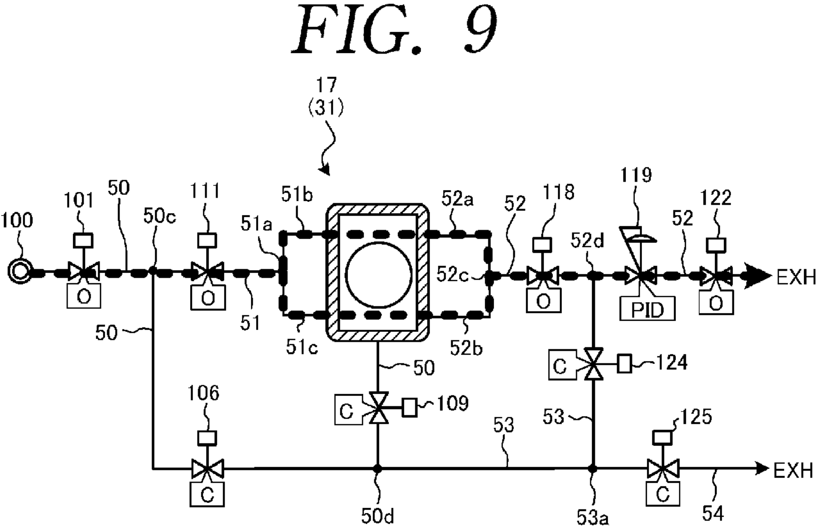
FIG. 9 is a diagram illustrating an operation example of the flowing processing according to the exemplary embodiment.

Reference is made back to FIG. 5. Next, in the substrate processing device 17, the flowing processing is performed (process S104). In this flowing processing, the valve 111 of the auxiliary supply line 51 and the valve 118 of the discharge line 52 are turned into the open state, and the valve 106 of the main supply line 50 and the valve 124 of the bypass line 53 are turned into the closed state, as shown in FIG. 9. FIG. 9 is a diagram showing an operation example of the flowing processing according to the exemplary embodiment.

Accordingly, in the processing space, a laminar flow of the processing fluid flowing above the wafer W toward the discharge header 38 (see FIG. 3) from the second supply header 37 (see FIG. 3) along the top surface of the wafer W is formed in the processing space.

Further, in this flowing processing, the valve 101 of the main supply line 50 and the valve 122 of the discharge line 52 are kept open, and the valve 109 of the main supply line 50 and the valve 125 of the branch line 54 are kept closed. Also, in this flowing processing, the pressure control valve 119 of the discharge line 52 is maintained in the PID control status.

In such a flowing processing, the pressure of the processing space is maintained at a pressure at which the supercritical state of the processing fluid is maintained. Specifically, as shown in FIG. 6, over a period from time T3 to time T4 during which the flowing processing is performed, the pressure of the processing space is maintained at a preset pressure P2 (for example, about 16 MPa).

Through this flowing processing, the processing fluid containing the additive A remaining on the top surface of the wafer W is replaced with the processing fluid containing no additive A. This flowing processing is performed until a stage in which the additive A remaining in the processing space is sufficiently reduced, for example, until a stage in which the concentration of the additive A in the processing space reaches zero percent (0%) to several percents.

Further, in the exemplary embodiment, the controller 19 may detect the pressure of the processing space during the flowing processing with the pressure sensor 117 (see FIG. 4), and perform the PID control over the pressure control valve 119 based on the detected pressure of the processing space. As a result, the pressure of the processing fluid within the processing vessel 31 can be maintained stable.

In the example of FIG. 6, the processing fluid flows to make the pressure of the processing space constant in the flowing processing. However, the pressure of the processing space in the flowing processing is not necessarily required to be constant.

Further, although the example of FIG. 6 has been described for the case where the preset pressure P2 is lower than the processing pressure P1, the present disclosure is not limited thereto. The preset pressure P2 may be approximately equal to the processing pressure P1, or the preset pressure P2 may be higher than the processing pressure P1.

Figure 10:
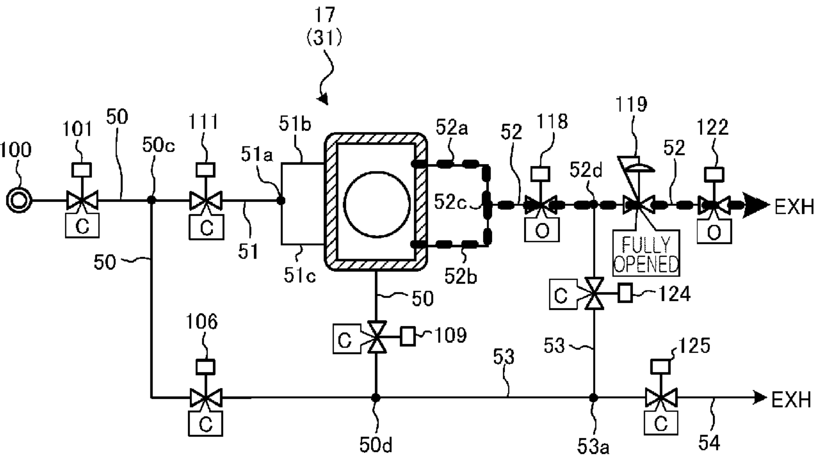
FIG. 10 is a diagram illustrating an operation example of the pressure reducing processing according to the exemplary embodiment.

Reference is made back to FIG. 5. Next, in the substrate processing device 17, the pressure reducing processing is performed (process S105). In this pressure reducing processing, the valve 101 of the main supply line 50 and the valve 111 of the auxiliary supply line 51 are turned into the closed state, and the pressure control valve 119 of the discharge line 52 is fully opened, as shown in FIG. 10. FIG. 10 is a diagram showing an operation example of the pressure reducing processing according to the exemplary embodiment.

Accordingly, the supply of the processing fluid to the processing space is stopped. Meanwhile, since the valves 118 and 122 and the pressure control valve 119 of the discharge line 52 are opened, the processing fluid in the processing space passes through the discharge line 52 to be discharged to the outside. As a result, the pressure in the processing space decreases.

Further, in this pressure reducing processing, the valves 118 and 122 of the discharge line are kept open, and the valves 106 and 109 of the main supply line 50, the valve 124 of the bypass line 53, and the valve 125 in the branch line 54 are kept closed.

This pressure reducing processing is performed until the pressure of the processing space drops to the atmospheric pressure. Specifically, as shown in FIG. 6, the pressure reducing processing is performed from time T4 to time T5, whereby the pressure of the processing space decreases from the processing pressure P1 to the atmospheric pressure.

Further, in the exemplary embodiment, after the pressure of the processing space is reduced to a certain pressure (e.g., about 3 MPa) to allow the processing fluid in the processing space to undergo a phase change from the supercritical state to a gaseous state, the processing fluid may be discharged through the bypass line 53 and the branch line 54.

Figure 11:
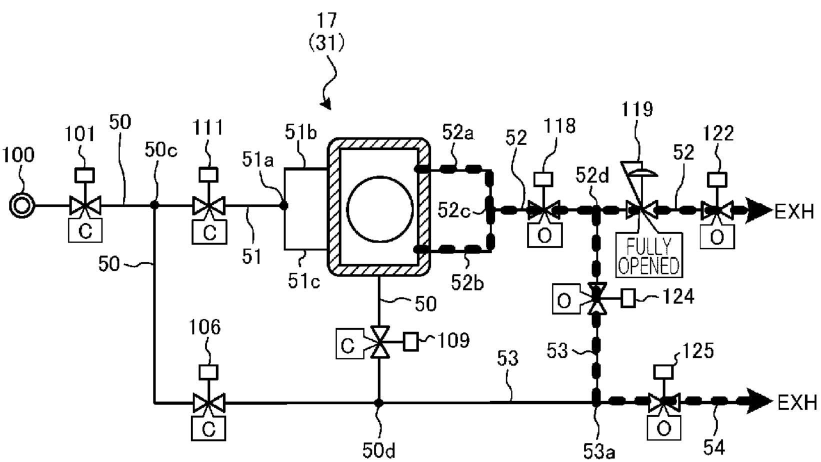
FIG. 11 is a diagram illustrating an operation example of the pressure reducing processing according to the exemplary embodiment.

Specifically, as shown in FIG. 11, the valve 124 of the bypass line 53 and the valve 125 of the branch line 54 are turned into the open state. FIG. 11 is a diagram showing an operation example of the pressure reducing processing according to the exemplary embodiment.

As a result, the processing fluid in the processing space is discharged to the outside through the bypass line 53 and the branch line 54 as well as the discharge line 52, so that the pressure reducing processing can be completed rapidly.

Reference is made back to FIG. 5. Subsequently, in the substrate processing device 17, a carrying-out processing is performed (process S106). In this carrying-out processing, the holding plate 32 and the cover member 33 move, so the wafer W after being finished with the drying processing is carried out from the processing space. Upon the completion of this carrying-out processing, the series of processes of the substrate processing for the single sheet of wafer W are completed.

Another Exemplary Embodiment

Now, a substrate processing according to another exemplary embodiment will be explained with reference to FIG. 12. In the following description of the another exemplary embodiment, parts identical to those of the above-described exemplary embodiment will be assigned same reference numerals, and redundant description thereof will be omitted.

Further, in the another exemplary embodiment, a sequence of respective processings of the substrate processing is the same as that shown in FIG. 5, and a pressure variation in the processing space over time during each of the respective processings is the same as that shown in FIG. 6. Further, since a carrying-in processing (S101) and a pressure increasing processing (process S102) according to the another exemplary embodiment are the same as those of the above-described exemplary embodiment, detailed description thereof will be omitted.

In a maintaining processing (process S103) according to the another exemplary embodiment, the processing space within the substrate processing device 17 is isolated, and the pressure of the processing space is maintained at the processing pressure P1 from time T2 to time T3, as illustrated in FIG. 6, the same as in the above-described exemplary embodiment. As a result, the required substrate processing is performed on the wafer W in the processing space.

Figure 12:
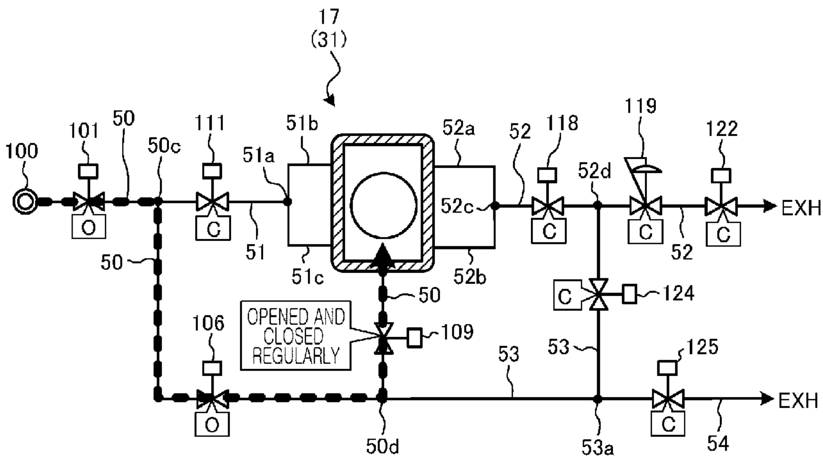
FIG. 12 is a diagram illustrating an operation example of a maintaining processing according to another exemplary embodiment.

In the maintaining processing according to the another exemplary embodiment, the valve 109 of the main supply line 50 is opened and closed regularly, as shown in FIG. 12. FIG. 12 is a diagram showing an operation example of the maintaining processing according to the another exemplary embodiment.

Further, in this maintaining processing, the valves 101 and 106 of the main supply line 50 are kept open. In addition, in this maintaining processing, the valve 111 of the auxiliary supply line 51, the valves 118 and 122 and the pressure control valve 119 of the discharge line 52, the valve 124 of the bypass line 53, and the valve 125 of the branch line 54 are kept closed.

Accordingly, as indicated by a thick dashed line in FIG. 12, the processing fluid of the high pressure is regularly supplied from the fluid source 100. Therefore, even when the pressure of the processing space tends to decrease, the pressure of this processing space can be easily returned to the processing pressure P1.

Therefore, according to the another exemplary embodiment, the processing fluid in the supercritical state can be stably sealed inside the processing vessel 31 over a long period of time. Further, since a flowing processing (process S104), a pressure reducing processing (process S105), and a carrying-out processing (process S106) according to the another embodiment are the same as those of the above-described exemplary embodiment, detailed description thereof will be omitted here.

A substrate processing method according to the exemplary embodiment is a substrate processing method of a substrate processing apparatus (substrate processing system 1) configured to process a substrate (wafer W) by bringing a processing fluid in a supercritical state into contact with the substrate (wafer W). The substrate processing apparatus (substrate processing system 1) includes the processing vessel 31, the main supply line 50, the discharge line 52, and the bypass line 53. The processing vessel 31 has a processing space for accommodating the substrate (wafer W) therein. The main supply line 50 supplies the processing fluid into the processing space. The discharge line 52 has a first opening/closing valve (valve 118), and discharges the processing fluid from the processing space. The bypass line 53 is branched off from the main supply line 50 at a branchpoint (branch portion 50*d*), and join the discharge line 52 at a junction point (junction portion 52*d*) downstream of the first opening/closing valve (valve 118). Further, the substrate processing method according to the exemplary embodiment of the present disclosure includes a pressure increasing process (process S102) and a maintaining process (process S103). In the pressure increasing process (process S102), while the substrate (wafer W) is accommodated in the processing space, the processing fluid is supplied from the main supply line 50 into the processing space, so that the pressure of the processing space is raised to the preset processing pressure P1. In the holding process (process S103), the pressure of the processing space is maintained at the processing pressure P1 while allowing the processing fluid to flow through the bypass line 53 in the state that the first opening/closing valve (valve 118) is closed, after the pressure increasing process (process S102). Accordingly, the processing fluid in the supercritical state can be stably sealed inside the processing vessel 31 over a long period of time.

Further, in the substrate processing method according to the exemplary embodiment, the main supply line 50 has a second opening/closing valve (valve 109) provided downstream of the branchpoint (branch portion 50*d*). With this configuration, the processing fluid can still flow through the bypass line 53 even when the supply of the processing fluid from the main supply line 50 into the processing space is stopped.

Moreover, in the substrate processing method according to the exemplary embodiment, in the maintaining process (process S103), the second opening/closing (valve 109) is opened and closed regularly. As a result, the processing fluid in the supercritical state can be more stably sealed inside the processing vessel 31 over a long period of time.

Additionally, in the substrate processing method according to the exemplary embodiment, the substrate processing apparatus (substrate processing system 1) is further equipped with the auxiliary supply line 51 configured to supply the processing fluid into the processing space. The main supply line 50 supplies the processing fluid toward a bottom surface of the substrate (wafer W) which is held horizontally within the processing vessel 31, and the auxiliary supply line 51 supplies the processing fluid in a horizontal direction to above the substrate (wafer W) which is held horizontally within the processing vessel 31. As a result, the additive A accumulated on the top surface of the wafer W is prevented from overflowing as a result of the processing fluid coming into contact with the top surface of the wafer W, and the processing fluid containing the additive A remaining on the top surface of the wafer W can be efficiently replaced with the processing fluid containing no additive A.

Moreover, in the substrate processing method according to the exemplary embodiment, the substrate processing apparatus (substrate processing system 1) is further equipped with the auxiliary supply line 51 configured to supply the processing fluid into the processing space. The main supply line 50 is provided upstream of the branchpoint (branch portion 50*d*), and has a first decompression valve capable of reducing the pressure on the downstream side thereof. Further, the auxiliary supply line 51 has a second decompression valve capable of reducing the pressure on the downstream side thereof. Then, in the maintaining process (process S103), the pressure of the processing fluid downstream of the first decompression valve and the second decompression valve is reduced to a preset pressure. Therefore, the running cost for the maintaining processing can be reduced.

In addition, in the substrate processing method according to the exemplary embodiment, the substrate processing apparatus (substrate processing system 1) is equipped with the fluid source 100 that supplies the processing fluid to the processing vessel 31. Further, the fluid source 100 has a decompression mechanism capable of reducing the pressure of the processing fluid being supplied. Then, in the maintaining process (process S103), the pressure of the processing fluid supplied from the fluid source 100 is reduced to a certain pressure. Therefore, the running cost for the maintaining processing can be reduced.

Additionally, a substrate processing method according to another exemplary embodiment is a substrate processing method of a substrate processing apparatus (substrate processing system 1) configured to process a substrate (wafer W) by bringing it into contact with a processing fluid in a supercritical state. The substrate processing apparatus (substrate processing system 1) includes the processing vessel 31 and the main supply line 50. The processing vessel 31 has a processing space for accommodating the substrate (wafer W) therein. The main supply line 50 has a second opening/closing (valve 109), and supplies the processing fluid to the processing space. Further, the substrate processing method according to the another exemplary embodiment of the present disclosure includes a pressure increasing process (process S102) and a maintaining process (process S103). In the pressure increasing process (process S102), by supplying the processing fluid from the main supply line 50 into the processing space in the state that the substrate (wafer W) is accommodated in the processing space, the pressure of the processing space is raised to the preset processing pressure P1. In the holding process (process S103), the pressure of the processing space is maintained at the processing pressure P1 while opening and closing the second opening/closing valve (valve 109) regularly, after the pressure increasing process (process S102). Therefore, the processing fluid in the supercritical state can be stably sealed inside the processing vessel 31 over a long period of time.

Further, in the substrate processing methods according to the respective exemplary embodiments, in the maintaining process (process S103), the processing vessel 31 is filled with the processing fluid containing the additive A, and the additive A contains a low-valent alcohol. Therefore, the required processing can be performed.

Furthermore, in the substrate processing methods according to the respective exemplary embodiments, the processing fluid is $CO_2$. Therefore, the required substrate processing can be performed.

In addition, a substrate processing apparatus (substrate processing system 1) according to the exemplary embodiment includes the processing vessel 31, the main supply line 50, the discharge line 52, the bypass line 53, and the controller 19. The processing vessel 31 has a processing space for accommodating a substrate (wafer W) therein. The main supply line 50 supplies a processing fluid in a supercritical state to the processing space. The discharge line 52 has a first opening/closing (valve 118), and discharges the processing fluid from the processing space. The bypass line 53 is branched off from the main supply line 50 at a branchpoint (branch portion 50*d*), and joins the discharge line 52 at a junction point (junction portion 52*d*) downstream of the first opening/closing valve (valve 118). Further, the controller 19 controls the individual components. The controller 19 raises the pressure of the processing space to a preset processing pressure P1 by supplying the processing fluid into the processing space from the main supply line 50 in the state that the substrate (wafer W) is accommodated in the processing space. Further, after the pressure of the processing space is raised up to the processing pressure P1, the controller 10 maintains the pressure of the processing space at the processing pressure P1 while allowing the processing fluid to flow through the bypass line in the state that the first opening/closing valve (valve 118) is closed. Accordingly, the processing fluid in the supercritical state can be stably sealed inside the processing vessel 31 over a long period of time.

Furthermore, in the substrate processing apparatus (substrate processing system 1) according to the exemplary embodiment, the main supply line 50 has a second opening/closing valve (valve 109) provided downstream of the branchpoint (branch portion 50*d*). With this configuration, the processing fluid can still flow through the bypass line 53 even when the supply of the processing fluid from the main supply line 50 into the processing space is stopped.

In addition, the substrate processing apparatus (substrate processing system 1) according to the respective exemplary embodiments the substrate processing apparatus (substrate processing system 1) is further equipped with an auxiliary supply line 51 configured to supply the processing fluid into the processing space. The main supply line 50 supplies the processing fluid toward a bottom surface of the substrate (wafer W) which is held horizontally within the processing vessel 31, and the auxiliary supply line 51 supplies the processing fluid in a horizontal direction to above the substrate (wafer W) which is held horizontally within the processing vessel 31. Therefore, the additive A accumulated on the top surface of the wafer W is prevented from overflowing as a result of the processing fluid coming into contact with the top surface of the wafer W, and the processing fluid containing the additive A remaining on the top surface of the wafer W can be efficiently replaced with the processing fluid containing no additive A.

So far, the exemplary embodiments of the present disclosure have been described. However, the present disclosure is not limited to the above-described exemplary embodiments, and various changes and modifications may be made without departing from the spirit of the present disclosure.

The exemplary embodiments disclosed herein are illustrative in all aspects and do not limit the present disclosure. In fact, the above exemplary embodiments can be embodied in various forms. Further, the above-described exemplary embodiments may be omitted, substituted, or changed in various forms without departing from the scope and spirit of the appended claims.

According to the exemplary embodiment, it is possible to seal the processing fluid in the supercritical state within the processing vessel stably over the long period of time.

I claim:

1. A substrate processing method performed in a substrate processing apparatus configured to process a substrate by bringing the substrate into contact with a processing fluid in a supercritical state, wherein the substrate processing apparatus comprises:

a processing vessel having a processing space in which the substrate is accommodated;

a main supply line configured to supply the processing fluid to the processing space;

a discharge line having a first opening/closing valve, the discharge line being configured to discharge the processing fluid from the processing space; and a bypass line branched off from the main supply line at a branch point, the bypass line joining the discharge line at a junction point downstream of the first opening/closing valve, and wherein the substrate processing method comprises:

increasing a pressure of the processing space up to a preset processing pressure by supplying the processing fluid to the processing space from the main supply line in a state that the substrate is accommodated in the processing space; and maintaining, after the increasing of the pressure of the processing space, the pressure of the processing space at the processing pressure while allowing the processing fluid to flow through the bypass line in a state that the first opening/closing valve is closed.

2. The substrate processing method of claim 1, wherein the main supply line has a second opening/closing valve provided downstream of the branch point.

3. The substrate processing method of claim 2, wherein, in the maintaining of the pressure of the processing space, the second opening/closing valve is opened and closed regularly.

4. The substrate processing method of claim 1, wherein the substrate processing apparatus further comprises an auxiliary supply line configured to supply the processing fluid to the processing space, the main supply line supplies the processing fluid toward a bottom surface of the substrate which is horizontally held within the processing vessel, and the auxiliary supply line supplies the processing fluid in a horizontal direction toward above the substrate which is horizontally held within the processing vessel.

5. The substrate processing method of claim 1, wherein the substrate processing apparatus further comprises an auxiliary supply line configured to supply the processing fluid to the processing space, the main supply line has a first decompression valve provided upstream of the branch point, and is configured to reduce a pressure on a downstream side thereof, the auxiliary supply line has a second decompression valve configured to reduce a pressure on a downstream side thereof, and in the maintaining of the pressure of the processing space, a pressure of the processing fluid downstream of the first decompression valve and the second decompression valve is reduced to a preset pressure.

6. The substrate processing method of claim 1, wherein the substrate processing apparatus comprises a fluid source configured to supply the processing fluid to the processing vessel, the fluid source has a decompressing mechanism configured to reduce a pressure of the processing fluid being supplied, and in the maintaining of the pressure of the processing space, the pressure of the processing fluid supplied from the fluid source is reduced to a preset pressure.

7. The substrate processing method of claim 1, wherein, in the maintaining of the pressure of the processing space, the processing vessel is filled with the processing fluid containing an additive, and the additive contains a low-valence alcohol.

8. The substrate processing method of claim 1, wherein the processing fluid is $CO_2$.

* * * * *